United States Patent [19]

Parry et al.

[11] Patent Number: 5,397,978
[45] Date of Patent: Mar. 14, 1995

[54] CURRENT LIMIT CIRCUIT FOR IGBT SPARK DRIVE APPLICATIONS

[75] Inventors: John Parry, Grass Valley; Richard D. Davis, Nevada City, both of Calif.

[73] Assignee: Silicon Systems, Inc., Tustin, Calif.

[21] Appl. No.: 924,180

[22] Filed: Aug. 3, 1992

[51] Int. Cl.[6] .................................................. G05F 1/44
[52] U.S. Cl. .................................. 323/280; 323/277; 323/284; 307/262
[58] Field of Search ............... 323/284, 285, 277, 276, 323/280; 307/262; 330/304, 253

[56] References Cited

U.S. PATENT DOCUMENTS

| | | | |
|---|---|---|---|
| 4,536,699 | 8/1985 | Baker | 323/280 X |
| 4,574,249 | 3/1986 | Williams | 330/59 |
| 4,855,687 | 8/1989 | Hebert | 330/304 |
| 4,862,114 | 8/1989 | Kleinberg | 331/158 |
| 5,084,668 | 1/1992 | Kotowski et al. | 323/280 X |
| 5,107,151 | 4/1992 | Cambier | 323/16 |
| 5,124,616 | 6/1992 | Wozesinski | 323/284 |
| 5,164,659 | 11/1992 | Schultz et al. | 323/284 X |
| 5,311,069 | 5/1994 | Austin | 307/262 |

OTHER PUBLICATIONS

Brown, Marty, *Practical Switching Power Supply Design*, 1990, Academic Press Inc., pp. 154–158.

*Primary Examiner*—Steven L. Stephan
*Assistant Examiner*—Y. Jessica Han
*Attorney, Agent, or Firm*—Hecker & Harriman

[57] ABSTRACT

An improved method for current limiting applications to control the current through MOSFETs or IGBTs. An amplifier having a single, high-frequency pole is used to drive the large gate capacitance of a power MOSFET or IGBT. The current in the power transistor generates a negative feedback voltage in a sensing resistor. This feedback voltage is compared with a reference voltage to determine the output voltage of the amplifier. This provides greater stability for driving IGBT transistors, and the actual frequency response is only dependent upon the poles generated by the power transistor and its load. The current in the transistor ramps up to a value determined by the reference voltage, and then settles to a constant value with little or no overshoot or oscillation.

16 Claims, 5 Drawing Sheets

U.S. Patent  Mar. 14, 1995  Sheet 1 of 5  5,397,978
FIG. 1
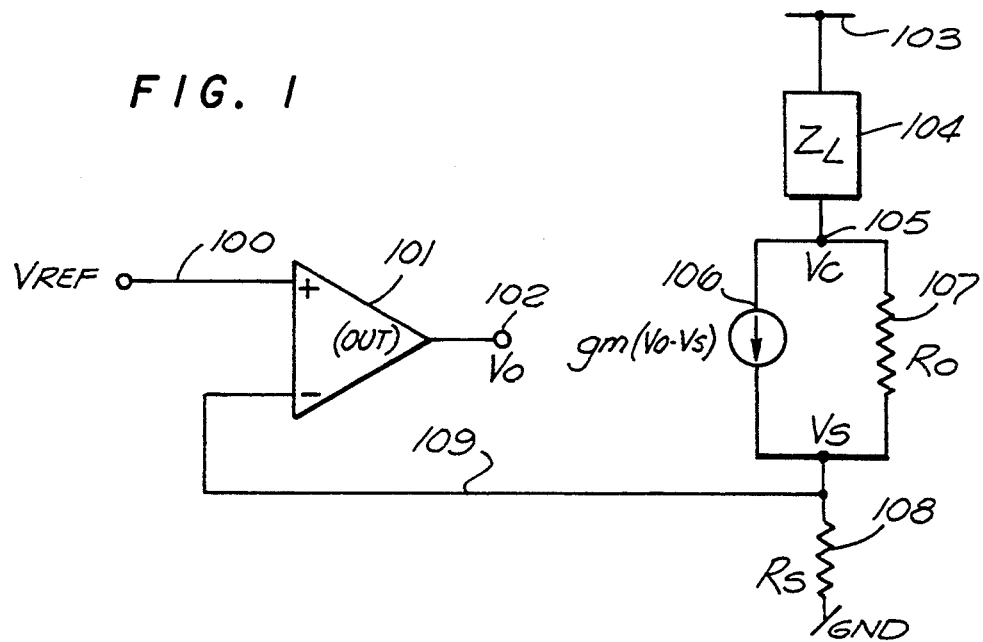
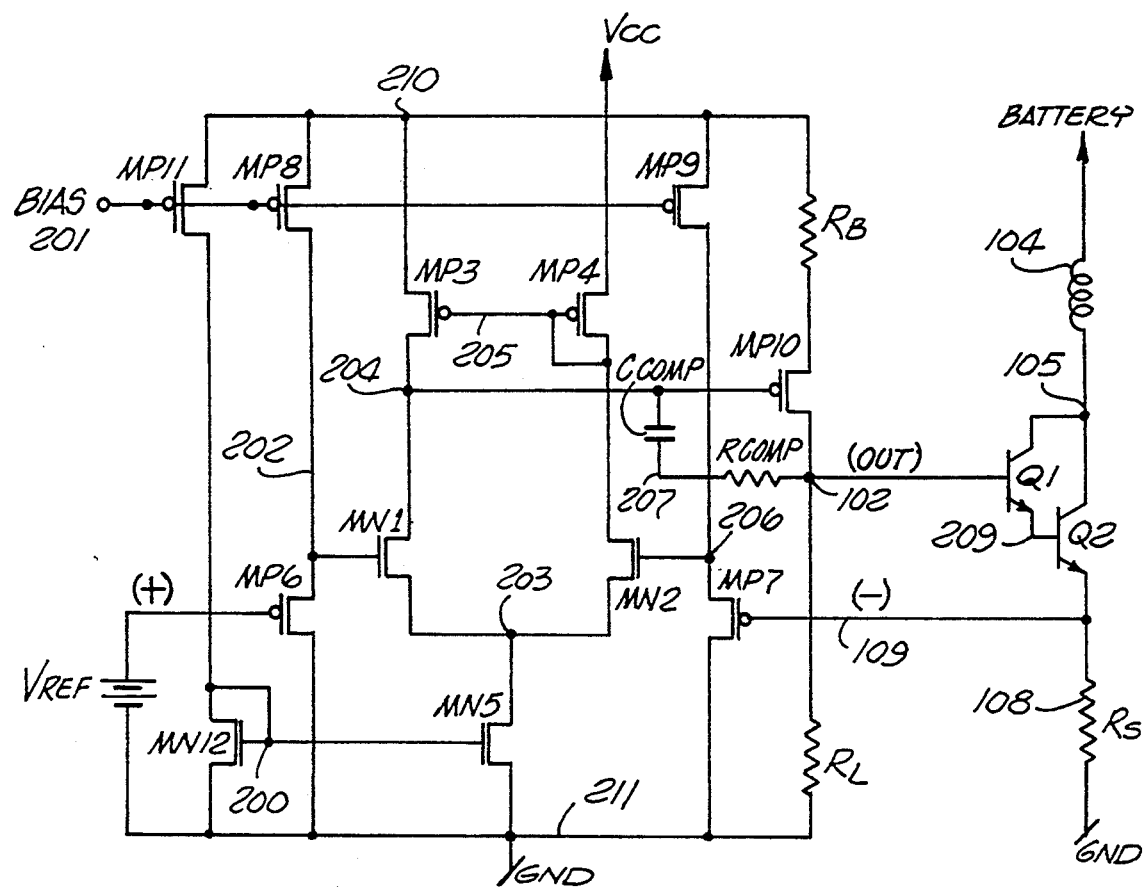
FIG. 2 (PRIOR ART)

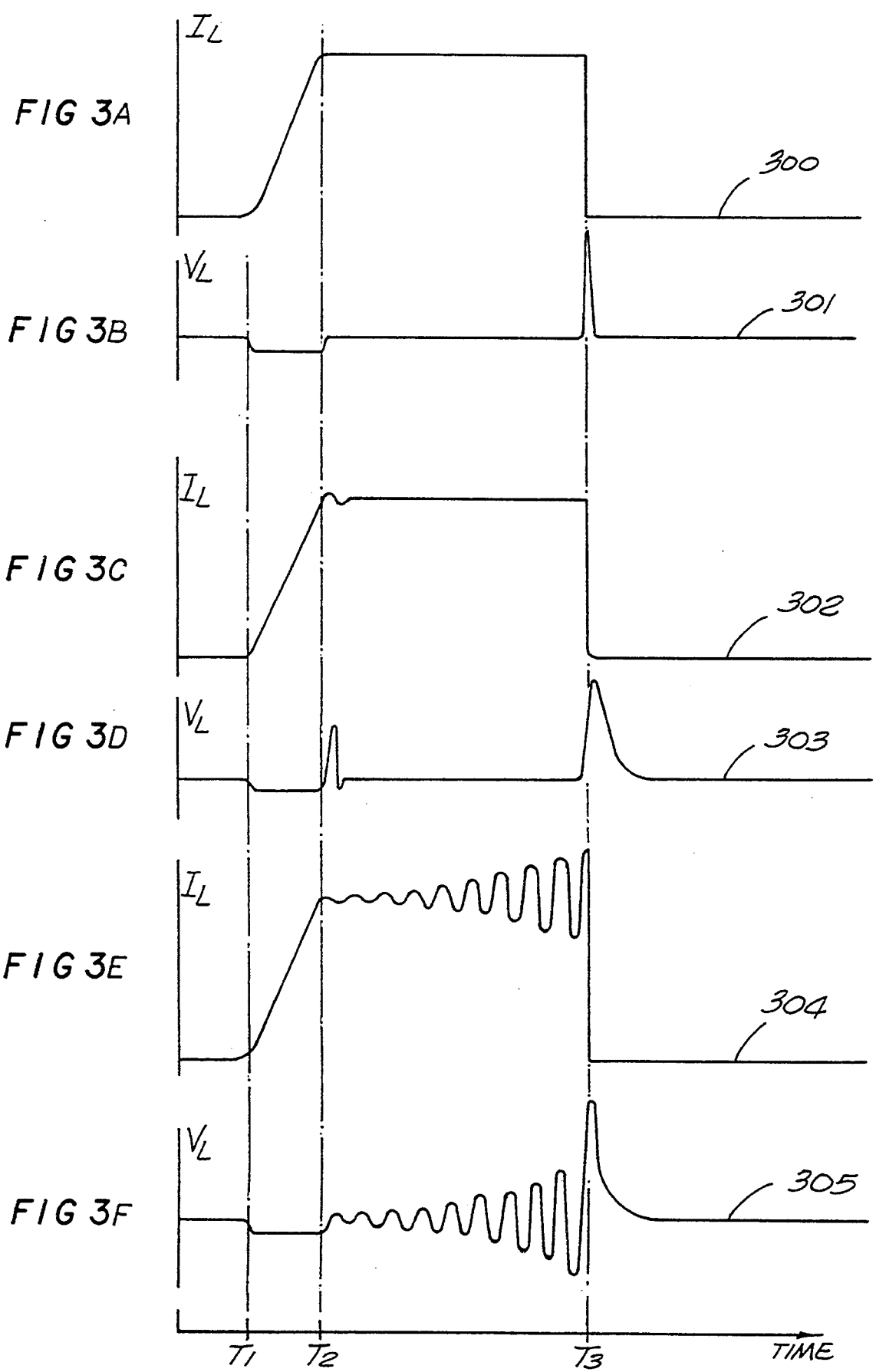

CURRENT LIMIT CIRCUIT FOR IGBT SPARK DRIVE APPLICATIONS

BACKGROUND OF THE INVENTION

1. Field of the Invention

The present invention relates to the field of current limiting, and in particular, to current limiting in spark coil applications.

2. Background Art

In spark coil applications, such as automobile ignition systems, a spark is generated when a sufficient voltage is generated across a spark gap for the spark to "jump." One method for generating this voltage is to use a primary coil (inductor) to transform a rapid change in current into a voltage, and then to use a secondary coil to scale the voltage up to the requisite amount for the spark to jump. The voltage across an inductor is equal to the rate of change of the current in its coils multiplied by its inductance. Thus, when a current in the primary coil is abruptly shut off, the sharp change in current induces a voltage across the coil. This is sometimes referred to as "flyback".

One method for generating a "flyback" voltage is for a ramping current to be supplied to the coil. After a specified time interval, the electrical connection supplying the current is abruptly broken, thereby providing the change in current necessary to generate the spark voltage. However, the energy in the spark is dependent on the magnitude of the current drop. Therefore, the spark energy is inconsistent, unless the connection is broken after the same time interval during each use. Too large of a spark can damage circuitry in sensitive applications.

Current limiting of the coil current provides predictable spark energies by regulating the current at a constant limit value. Once the current reaches its limit value, the spark energy is constrained to the value defined for that specific current magnitude. Thus, current limiting creates safe and predictable spark energies that are independent of time.

A circuit model of a current limiting circuit is shown in FIG. 1. The primary coil is modelled as an inductive impedance 104 ($Z_L$) coupled between a battery 103 and node 105. The model for the current source comprises an ideal dependent current source 106 in parallel with a finite resistance 107 (Ro). The parallel elements are coupled between nodes 105 and 109. A resistor 108, Rs, is coupled between node 109 and ground (GND). An amplifier 101 has its inverting input port (−) coupled to node 109, and its noninverting input port (+) coupled to a reference node 100 (VREF). The output 102 of amplifier 101 is provided as a control voltage (VO) to the dependent current source 106.

In this configuration, the amplifier alters VO to decrease the potential difference between VREF and VS, the voltage at node 109. The output of the amplifier is determined by the following equation:

$$VO = A(s)[VREF - VS],$$

where, in the prior art, $$A(s) = \frac{A_o}{\left(1 - \frac{s}{P_A}\right)\left(1 - \frac{s}{P_B}\right)}$$

In the above equations, $A(s)$ is the frequency dependent gain of a two-pole amplifier, $A_o$ is the DC gain of the amplifier, "s" is a complex frequency variable, and $P_A$ and $P_B$ are the frequencies of the amplifier's poles. Using a transistor model for the current source yields the following equation for the current through current source 106:

$$I = gm(VO - VS)$$

where "I" is the current generated, and "gm" is the transconductance of the transistor(s) used to make the current source. The total current supplied to the primary coil is equivalent to the voltage VS at node 109 divided by the resistance of the sensing resistor, Rs 108. The effect of the inductive load on the system is to generate an additional pole in the open-loop frequency response of the amplifier. The additional pole is located approximately at $$P_I = \left(\frac{gm \cdot Rs \cdot Ro}{L}\right)$$

where Ro is the output impedance of the transistor current source, as seen by the inductive load, and the complex impedance of the coil is ($Z_L = sL$), L being the inductance value of the coil. For the system configuration shown in FIG. 1, the open-loop transfer function of the amplifier and the current source is:

$$\frac{VS}{(VREF - VS)} = A(s) \cdot \frac{1}{\left(1 - \frac{s}{P_I}\right)}$$

The effect of a pole on the frequency response of a system is to change the slope (roll-off) of the magnitude by −6 dB per octave, and to decrease the phase margin by 90°. The magnitude and phase margin of the frequency response at the location of a first "dominant" pole are approximately (DC gain −3 dB) and 135°, respectively. The effect of a pole on the frequency response of a system can be seen by approximating the magnitude and phase for $\omega = 0$, $\omega = P$ and $\omega >> P$, in the following example, where $s = j\omega$.

Response =

$$\begin{cases} \frac{1}{1 - j0} = 1 \angle (0°), & \omega = 0 \\ \frac{1}{1 - j} = \frac{1}{\sqrt{2}} \angle(-45°) \to -3dB, & \omega = |P| \\ \frac{1}{1 - j\left(\frac{\omega}{P}\right)} \sim |P|\left(\frac{1}{\omega}\right)\angle(-90°) \to -6\frac{dB}{\text{octave}}, & \omega >> |P| \end{cases}$$

The phase margin of the response is equal to $180° - \angle(\text{-phase})$.

FIG. 7A is a graph of the simple pole response in dB (i.e. 20 $\log_{10}$ magnitude). The magnitude and phase margins are shown as curves 700 and 701, respectively. At frequencies much greater than $|P|$, the magnitude approaches an asymptote of −6 dB/octave, and the phase margin levels off at 90°. For a multiple pole system, each consecutive pole increases the rolloff asymptote by −6 dB/octave, and provides a 90° drop in phase margin. The contribution of each individual pole is easily discernible for poles that are widely separated (i.e. by a factor of ten or more). However, if a pole is in close proximity to another, the characteristics of the second pole influence those of the first pole, driving the magnitude and phase down at a faster rate than is normally the case for separated poles.

FIG. 7B illustrates the effects of adjacent poles in the frequency response. In FIG. 7B, a second pole, P', is located at twice the frequency of pole P. The frequency response resulting from these adjacent poles appears to be that of a single pole with twice the rolloff rate and twice the phase margin drop. This occurs due to the exponential relationships of the phase and magnitude in dB. The multiplication of the individual pole terms results in addition of the individual phase response of each term as well as addition of the individual rolloff factors (in dB). Thus, unless a pole is significantly higher in frequency than the pole of interest, the response of the system is degraded to some extent by the higher frequency pole.

In a system with negative feedback, 180° of phase margin in the open loop response implies that the feedback signal is 180° out of phase with the input signal. This is appropriate for a stable feedback system. However, at 0° or less phase margin, the feedback signal is in phase with the input signal and therefore creates positive feedback. If the open-loop gain of the system is larger than unity (0 dB) at this point, the system is unstable in feedback. It is therefore essential to maintain phase margin above 0° until the open-loop gain has dropped below unity. For this reason, the addition of external poles to a system, such as those created by inductive loads, can destroy the stability of an otherwise functional system.

A prior art system for controlling current in the primary coil utilizes two power bipolar junction transistors (BJTs) in a Darlington configuration to provide the large current source for the coil. The amplifier used to drive the power transistors is a compensated, two-pole amplifier. FIG. 2 is a circuit diagram of the prior art system. As shown, the amplifier comprises a level shifter stage (MP6-9), a single-ended, differential gain stage (MN1-2, MN5, MP3-4), and a second gain stage (MP10, RL) driving the Darlington pair (Q1-2).

In the input buffer stage, P-channel MOSFET MP6 is coupled between ground node 211 and node 202. The gate of MP6 represents the noninverting input (+) of the amplifier and is coupled to the reference voltage VREF at node 100. P-channel MOSFET MP7 is coupled between ground node 211 and node 206. The gate of MP7 represents the inverting input (−) of the amplifier and is coupled to the sensing voltage node 109. P-channel MOSFET MP8 is coupled between the local voltage supply node 210 and node 202. P-channel MOSFET MP9 is coupled between node 210 and node 206. The gates of MP8 and MP9 are coupled to BIAS node 201. Transistors MP6-7 are coupled in common-source configurations to provide level-shifting and buffering of the input signals. Transistors MP8-9 produce bias currents for transistors MP6 and MP7, respectively.

The first gain stage of the amplifier is comprised of a source-coupled differential pair of N-channel MOSFETs with a P-channel current-mirror providing an active load. N-channel MOSFET MN1 is coupled between nodes 203 and 204, and its gate is coupled to node 202 to receive the output of the noninverting input buffer MP6. N-channel MOSFET MN2 is coupled between nodes 203 and 205, and its gate is coupled to node 206 to receive the output of the inverting-input buffer MP7. N-channel MOSFET MN5 is coupled between node 203 and ground node 211 to function as a current source for the differential pair (MN1-2). The gate of MN5 is coupled to node 200, as are the gate and drain of bias transistor MN12. N-channel MOSFET MN12 is source coupled to ground node 211.

Transistors MN5 and MN12 form a current mirror supplied with a reference current by P-channel MOSFET MP11. MP11 is coupled between nodes 210 and 200 with its gate coupled to BIAS node 201. The sources of P-channel MOSFETs MP3 and MP4 are coupled to node 210, and both gates are coupled to node 205. The drains of transistors MP3 and MP4 are coupled to nodes 204 and 205, respectively. In this configuration, MP3 and MP4 form a current mirror that acts as the active load for this stage. The single-ended output is taken from the high impedance node 204.

The second gain stage is comprised of a single P-channel MOSFET with a load resistance, RL, coupled to its drain. Transistor MP10 is coupled between nodes 208 and 102. The gate of MP10 is coupled to node 204, the output of the previous gain stage. Resistor RB is coupled between nodes 208 and 210 to control the offset and drift of the amplifier. Resistor RL is coupled between nodes 102 and 211. The gain of this stage is dependent on the parallel resistance of RL and the input resistance of the Darlington pair. Capacitor CCOMP is coupled between nodes 204 and 207, and resistor RCOMP is coupled between nodes 207 and 102. RCOMP and CCOMP provide frequency compensation for the two-pole amplifier. The output of the amplifier is taken from node 102 (OUT).

The Darlington pair current source is comprised of NPN bipolar junction transistors (BJTs) Q1 and Q2. The base of transistor Q1 is coupled to node 102, the collector is coupled to node 105, and the emitter is coupled to the base of transistor Q2 (node 209). The collector of Q2 is coupled to node 105 and the emitter is coupled to node 109. Resistor 108 (Rs) is coupled between node 109 and ground node 211. The primary coil 104 is coupled between a battery and node 105.

The poles of the amplifier are generated at the high impedance output nodes of each gain stage. As is common in the art, a compensation capacitor (CCOMP) and resistor (RCOMP) are connected in series between the output nodes of each gain stage, thus accomplishing Miller amplification of the compensation elements. The compensation induces a pole splitting effect that lowers the frequency of the lower pole and increases the frequency of the upper pole, thereby allowing the gain to roll-off to 0 dB before the second pole degrades the phase margin. Thus, by splitting the poles in a two-pole system, the phase margin may be increased.

FIG. 4A is a graph of the frequency response of a prior art current limiting circuit driving a Darlington pair. For illustrative purposes, only the asymptotes of the magnitude response are shown. The two-pole amplifier contributes poles $P_A$ and $P_B$, and the Darlington and load contribute $P_I$. At the frequency, $|P_A|$, the phase margin is equal to 135°, and the magnitude begins to roll off from its DC value at a rate of −6 dB/octave. Due to the compensation of the prior art, $P_B$ occurs after the magnitude has rolled off significantly. At $|P_B|$, the phase margin decreases to 45°, and the magnitude roll off increases to −12 dB/octave. The large transconductance of the Darlington pair places $P_I$ much higher than $P_B$. This prevents $P_I$ from having a significant effect on the response. This system is stable in unity-gain feedback because the magnitude of the response drops below 0 dB before the phase margin drops below 0°. Unfortunately, the Darlington pair in this system requires a considerable amount of standby current and thus dissipates a considerable amount of power. Also, for phase margins less than 60°, some overshoot may occur in the closed loop system.

The two-pole amplifier loop provides adequate current limiting for a power Darlington configuration or another bipolar device because the pole introduced by such devices is high enough in frequency to avoid significant interaction with the poles of the amplifier. This is mainly due to the relatively large transconductance (gm) and small parasitic capacitances of such devices. However, if the Darlington pair is replaced by a power MOSFET or an IGBT, the circuit loses phase margin. MOSFETs and IGBTs have inherently smaller transconductance and larger parasitic capacitances that create lower frequency poles, potentially making the loop unstable. Instability causes overshoot or oscillation in the coil current waveform that discharges the coil if the magnitude of the change in current per unit time is significant. Thus, overshoot or oscillation can fire the spark prematurely.

FIG. 4B is a graph of the open-loop frequency response of the prior art two-pole amplifier system driving an IGBT. In this case, the lower transconductance of the IGBT reduces the frequency of $P_I$ such that it is in close proximity to $P_B$. Because $P_I$ and $P_B$ are so near to each other, and because the gain has not rolled off sufficiently at $|P_I|$, the phase margin is drastically degraded with the result that the phase margin drops below 0° before the magnitude can drop below unity gain. This system is therefore unstable in unity gain feedback systems. Positive feedback is generated for frequency components between the frequency at which the phase margin is less than 0° and the frequency at which the magnitude equals 0 dB (unity gain). The system experiences increasing oscillations at these frequencies, even after the input falls to zero.

FIGS. 3A-F illustrate current and voltage waveforms in the primary coil during a sparking operation. Referring to FIGS. 3A-B, curve 300 depicts an ideal current waveform ($I_L$) and curve 301 depicts an ideal voltage waveform ($V_L$) for a system with more than 90° of phase margin. At time T1, the current 300 begins ramping up to its constant value, and voltage 301 experiences a negative step proportional to the derivative of the current. At time T2, current 300 reaches its constant value (determined by VREF), and voltage 301 returns to zero. At time T3, the output of the amplifier is disconnected from the base of the power transistor, current 300 steps down to zero, and voltage 301 experiences a sharp voltage spike with an exponential return to zero.

Referring to FIGS. 3C-D, curve 302 depicts the current waveform with overshoot at time T2, resulting from a phase margin of between 0 and 90°. Curve 303 depicts the corresponding voltage waveform which contains a moderate voltage spike near time T2, due to the overshoot in curve 302. If the voltage spike near T2 is above the spark threshold, the circuit discharges prematurely.

Referring to FIGS. 3E-F, curve 304 depicts the current waveform with oscillations due to instability caused by a negative phase margin, and curve 305 depicts the voltage waveform containing sympathetic oscillations corresponding to the time derivative of curve 304. When the magnitude of the oscillations in curve 305 reach the spark threshold, the coil discharges.

Despite these problems, the use of an IGBT has several advantages. An IGBT has the advantage of requiring minimal drive current to maintain its "on" state. The IGBT behaves like a MOSFET, in that it requires just picoamps of gate current to maintain peak drain current at low Vds (drain-source voltage). The Darlington pair, however, draws tens of milliamps of base current at peak collector current with Vce (collector-emitter voltage) less than one volt. This means that the drive circuit for the Darlington pair has a greater standby power consumption than does a drive circuit for an IGBT. Also, the minimum Vds of the IGBT (fully on) is typically lower than either a Darlington pair or a comparable power MOSFET. The reduction in power dissipation results in lower die temperatures and thus longer life for the IGBT. For these reasons, it is preferable for an IGBT to be used in the sparking systems. However, the known methods for current limiting are not applicable to these devices, due to the low frequency poles they introduce and the resulting consequences.

SUMMARY OF THE PRESENT INVENTION

The present invention provides an improved method for current limiting applications to control the current through a power MOSFET or IGBT. An amplifier having a single, high-frequency pole is used to drive the large gate capacitance of a power MOSFET or IGBT. The current in the power transistor generates a negative feedback voltage in a sensing resistor. This feedback voltage is then compared with a reference voltage to determine the output voltage of the amplifier. This system configuration provides greater stability for driving MOSFETs and IGBTs. Because the IGBT and its load introduce a pole that is much lower in frequency than the pole of the amplifier, the frequency response of the system is solely dependent on the load-induced pole. The frequency of the single pole of the amplifier is sufficiently high to prevent degradation of the phase margin of the system. An emitter-follower is used to drive the gate capacitance of the power transistor and prevent the capacitance from contributing a dominant pole to the system. The use of an IGBT transistor reduces the power consumption of the system and thereby increases the circuit's lifetime.

The current in the IGBT ramps up to a value determined by the reference voltage, and then settles to a constant value with little or no overshoot or oscillation. For sparking applications, at a chosen instant, the amplifier is decoupled from the power transistor, and a sharp "flyback" voltage spike is induced in the primary coil due to the abrupt stoppage of current flow.

BRIEF DESCRIPTION OF THE DRAWINGS

FIG. 1 illustrates a circuit model for a current limiting system.

FIG. 2 is a circuit diagram of a current limiting system of the prior art.

FIGS. 3A-B depict ideal current and voltage waveforms in the inductive load.

FIGS. 3C-D depict current and voltage waveforms containing overshoot.

FIGS. 3E-F depict current and voltage waveforms containing oscillations due to system instability.

DETAILED DESCRIPTION OF THE PRESENT INVENTION

An apparatus for limiting current in spark applications is described. In the following description, numerous specific details are described in order to provide a more thorough description of the present invention. It will be apparent, however, to one skilled in the art, that the present invention may be practiced without these specific details. In other instances, well-known features have not been described in detail in order not to unnecessarily obscure the present invention.

The circuit of the present invention provides stable current limiting of MOSFETs and IGBTs driving inductive loads. The application of current limiting to spark applications is an example of one possible utilization of the present invention. However, the present invention can be applied to any system requiring current limiting or current control of inductive loads, such as in DC motor applications.

In the preferred embodiment of the present invention, a single-pole, large bandwidth amplifier is used to drive the gate of an IGBT (insulated gate bipolar transistor). Negative feedback is applied to the amplifier such that the current through the IGBT is driven to a specified level determined by a reference voltage applied to the noninverting input of the amplifier. The feedback is obtained by sampling the voltage across a sense resistor coupled in series with the IGBT.

Because the load for the IGBT is primarily inductive, a relatively low frequency pole is created in the open-loop frequency response of the system. By using a high bandwidth, single-pole amplifier, the situation is created wherein the pole from the IGBT and its load determines the frequency response of the whole system. In the preferred embodiment, the pole of the amplifier is located at a much higher frequency than the pole caused by the load, thereby assuring that sufficient phase margin is available for the system to be stable in a unity-gain feedback configuration. Contrary to designs of the prior art, this design allows for system designers to ignore the frequency dependence of the amplifier and, in essence, consider the amplifier as a black box with a constant gain. The designers can then predict the performance of the system from an IGBT data sheet and the value of their load, with only a general concern regarding the allowable range of the amplifier for a particular gain value. Thus, the designer's job is greatly simplified.

Figure 4A:
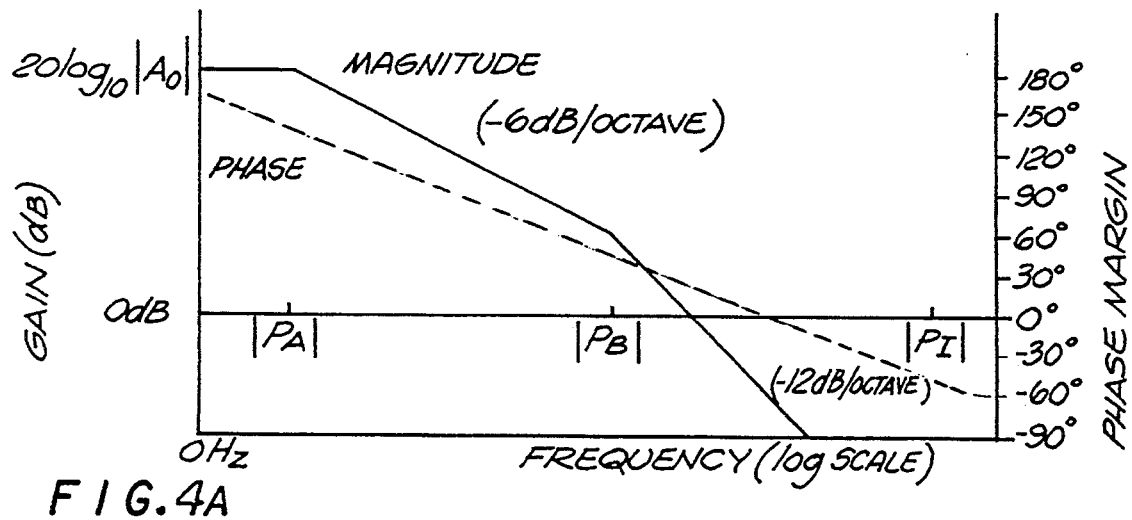
FIG. 4A illustrates the open-loop frequency response of the two-pole amplifier system utilizing a Darlington pair as in the prior art.
Figure 4B:
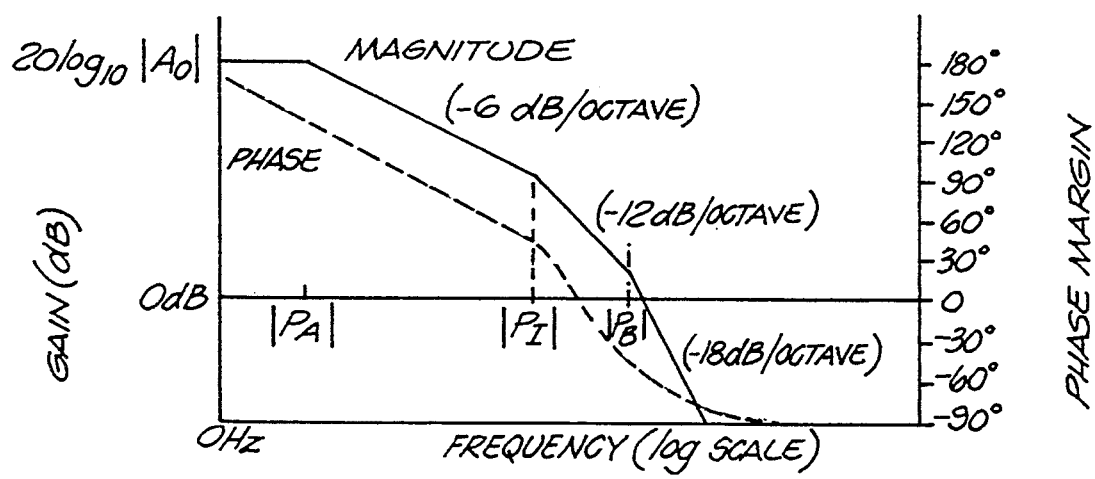
FIG. 4B illustrates the open-loop frequency response of the two-pole amplifier system utilizing a MOSFET or IGBT.
Figure 4C:
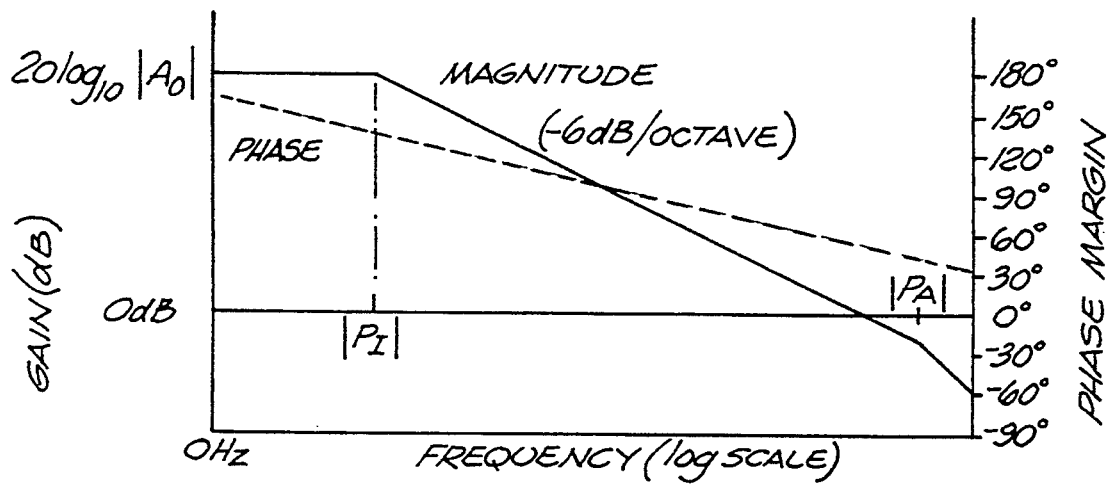
FIG. 4C illustrates the open-loop frequency response of the one-pole amplifier system of the present invention.

FIG. 4C is a graph of the open-loop frequency response for the system of the present invention. In the system of the present invention, the pole $P_B$ is at a high frequency relative to $P_A$ and $P_I$, and can be ignored. As shown, the pole $P_I$ determines the frequency response of the system. The gain begins to roll off at $|P_I|$, but the amplifier pole $P_A$ does not increase the gain roll-off until the magnitude is near or below 0 dB. If $P_A$ is higher in frequency than the 0 dB crossover point, then the feedback system is guaranteed at least 45° of phase margin. An amplifier designer, given the location of $P_I$, can optimize the system for either high open-loop gain or better phase margin by manipulating the location of $P_A$. A wide bandwidth prevents any loss of phase margin in the loop, whereas high gain minimizes offset voltage errors.

Figure 5:
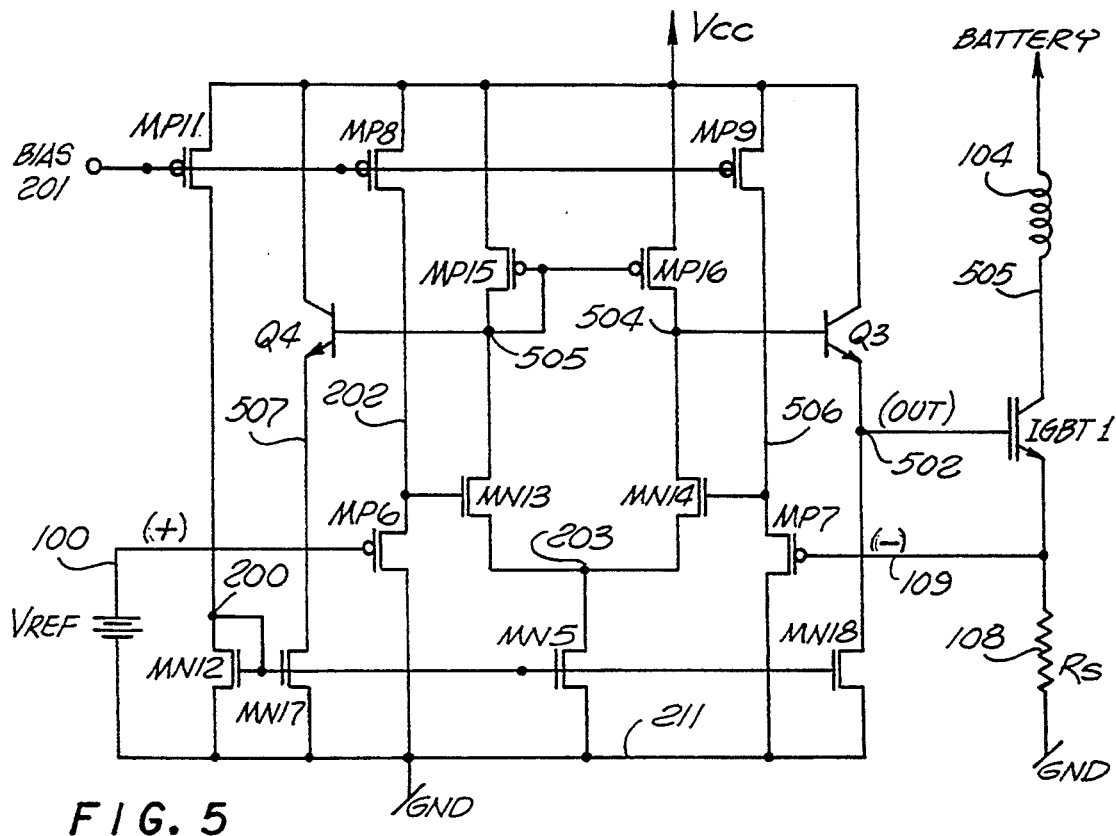
FIG. 5 is a circuit diagram of a CMOS or BiCMOS implementation of the preferred embodiment of the present invention.

A CMOS or BiCMOS implementation of the preferred embodiment of the present invention is shown in FIG. 5. The amplifier comprises a single gain stage, shown in FIG. 5 as a differential pair of NMOS transistors (MN13-14) having PMOS active loads (MP15-16). Transistors MP6 and MP7 act as unity-gain level shifters in this embodiment. A bipolar parasitic vertical structure, found in most CMOS processes, forms a unity-gain emitter-follower (Q3) that is used to drive the gate of IGBT1. The emitter-follower buffers the gain stage from parasitics, and forms a low impedance output stage useful for charging the gate-source capacitance of the external power device (IGBT or MOSFET). This emitter-follower can be replaced with an NMOS device in order to minimize offset error at the expense of the amplifier's output impedance and output swing. A single IGBT (IGBT1) replaces the Darlington pair of the prior art.

The noninverting input to the amplifier is node 100, which is coupled to the gate of PMOS transistor MP6 and an external voltage reference, VREF. Transistor MP6 is coupled between nodes 202 and 211 (GND). The inverting input to the amplifier is node 109, which is coupled to the gate of PMOS transistor MP7, the emitter of IGBT1 and one terminal of the sensing resistor, Rs. Transistor MP7 is coupled between nodes 506 and 211. The gates of NMOS differential pair MN13 and MN14 are coupled to nodes 202 and 506, respectively. MN13 and MN14 are source-coupled to node 203, and their drains are coupled to nodes 505 and 504, respectively. The drains of PMOS transistors MP15 and MP16 are coupled to nodes 505 and 504, respectively, and their sources are coupled to node 210 (VCC power supply). The gates of MP15 and MP16 are coupled to node 505 to form a current-mirror active load for the differential pair.

The base of NPN transistor Q3 is coupled to high impedance node 504, the output of the differential gain stage. The collector of Q3 is coupled to node 210, and the emitter is coupled to node 502, the amplifier output. External to the amplifier, the coil 104 is coupled between a battery and the collector of IGBT1 (node 505). The gate of IGBT1 is coupled to node 502, and its emitter is coupled to node 109. Sensing resistor Rs (108) is coupled between node 109 and ground (GND).

The bias circuit of the amplifier consists of PMOS transistors MP8, MP9 and MP11; NMOS transistors MN5, MN12, MN17 and MN18; and NPN transistor Q4. MP8, MP9, MP11, MN5, MN12, MN17 and MN18 represent current sources. The sources of transistors MP8, MP9 and MP11 are coupled to node 210, whereas the sources of transistors MN5, MN12, MN17 and MN18 coupled to node 211. The gates of MP8, MP9 and MP11 are coupled to BIAS node 201. The gates of MN5, MN12, MN17 and MN18, as well as the drains of MP11 and MN12, are coupled to node 200. The currents generated in these bias transistors are all proportional to each other with the proportionality being determined by the sizing of the individual transistors.

The drains of MP8 and MP9 are coupled to nodes 202 and 506, respectively. The currents generated at nodes 202 and 506 determine the amount of level-shifting performed by transistors MP6 and MP7. The drains of MN17 and MN18 are coupled to nodes 507 and 502, respectively. The drain of MN5 is coupled to node 203. The collector, base and emitter of NPN transistor Q4 are coupled to nodes 210, 505 and 507, respectively. The base current of transistor Q4 compensates for the base current of Q3, that would otherwise produce a systematic offset voltage. Transistors MN17 and Q4 are omitted from the circuit if transistor Q3 is replaced by an NMOS device.

As stated above, transistors MP6 and MP7 perform level-shifting of the inverting and noninverting inputs to the amplifier, 109 and 100. This allows for a greater amplifier input range without saturation. The gate voltages of transistors MP6 and MP7 are shifted upwards by a voltage factor dependent on the current supplied to their sources by the bias circuit. The AC voltage gain of these transistors is substantially equal to unity, therefore the differential voltage defined by the voltage across the gates of MP6 and MP7 is substantially equivalent to the differential voltage across the gates of transistors MN13 and MN14.

Transistors MN13 and MN14 perform current steering functions within the gain stage of the amplifier. Transistor MN5 acts as a constant current source, thereby creating a condition in which the sum of the currents in MN13 and MN14 is constant. However, transistor MN13 draws more current than MN14 when the voltage at node 202 is higher than that of node 506, and MN14 draws more current than MN13 when the voltage at node 506 is higher than that of node 202. Due to the current mirroring effect of transistors MP15 and MP16, the current provided to the drain of MN14 from MP16 is equal to the amount of current provided to the drain of MN13 from transistor MP15. The differential current is provided to high impedance node 504, charging node 504 when the differential current is positive, and discharging node 504 when the differential current is negative. Thus, transistors MN13 and MN14 steer current into, or away from, node 504.

Bipolar junction transistor Q3 is configured as an emitter follower having substantially unity gain with a downward level shift equal to the base-emitter voltage of the BJT (about 0.7 volts). This emitter-follower has a large input impedance at the base of Q3 for maintaining the gain of the differential stage, but it presents a small output impedance to node 502. This assists in the charging and discharging of the large capacitive load at the gate of the IGBT (IGBT1) or power MOSFET.

IGBT1 pulls current through the load 104 according to the voltage across its gate (node 502) and emitter (node 109). The load current generates a feedback voltage across resistor Rs that is provided to the inverting input of the amplifier to be compared with the voltage reference, VREF.

Figure 6:
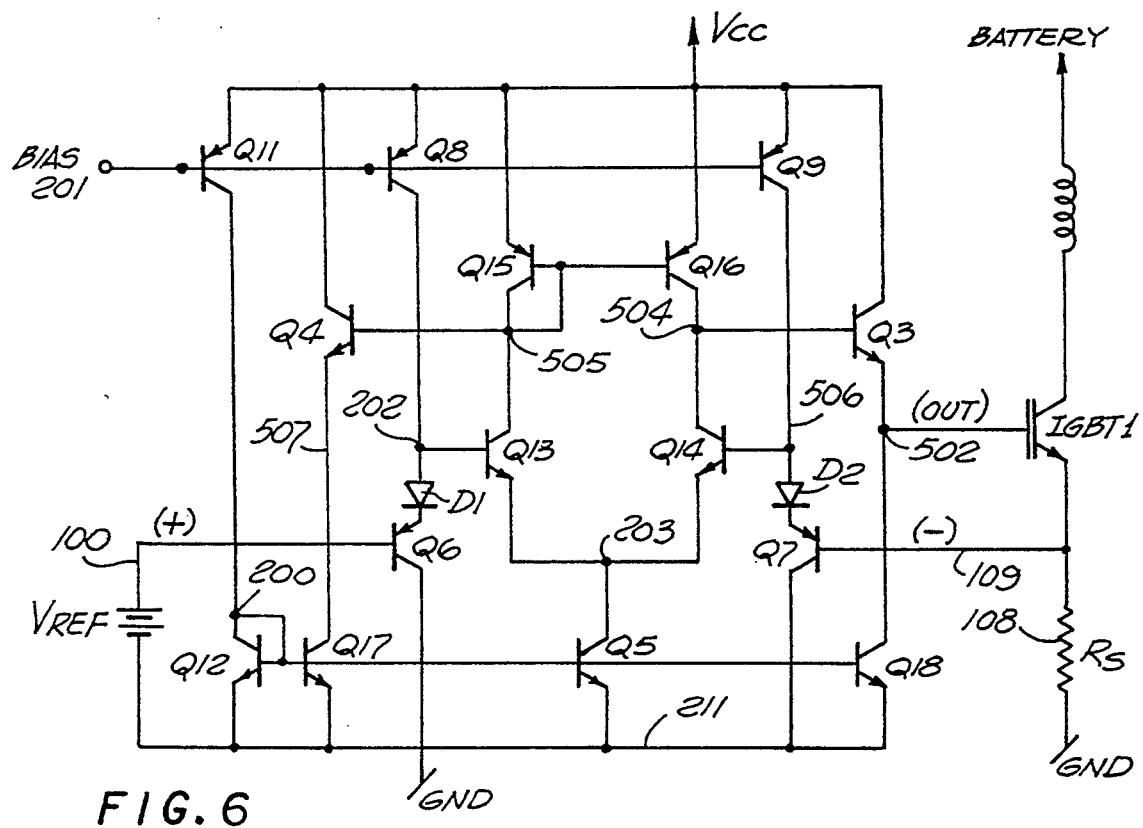
FIG. 6 is a circuit diagram of a bipolar implementation of the preferred embodiment of the present invention.
Figure 7A:
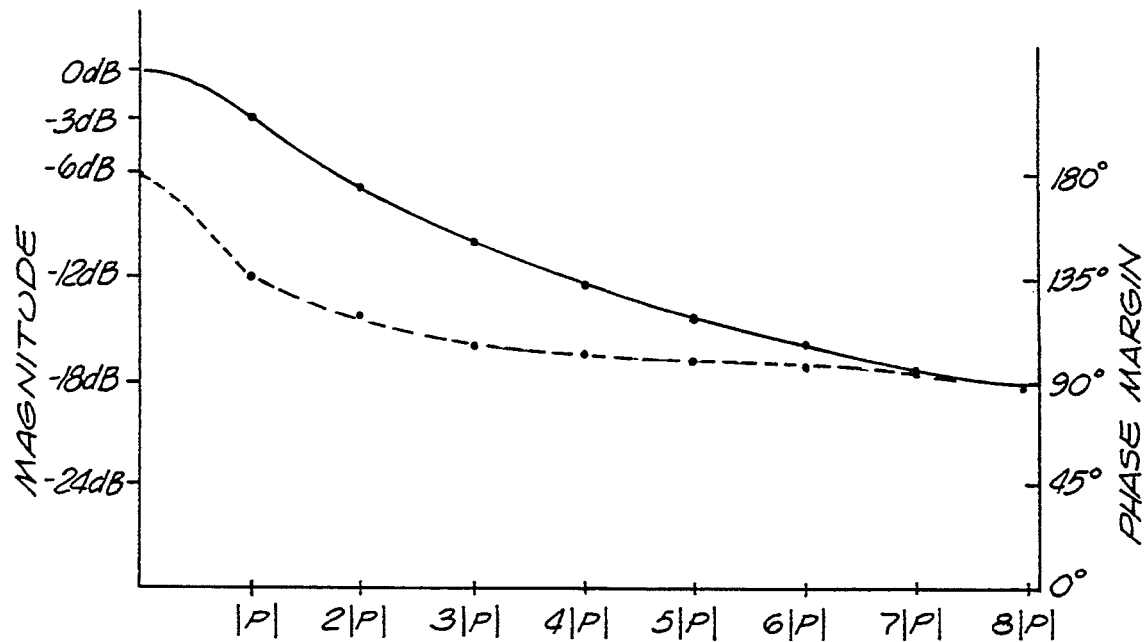
FIG. 7A is a graph of the magnitude and phase response of a system having a single pole.
Figure 7B:
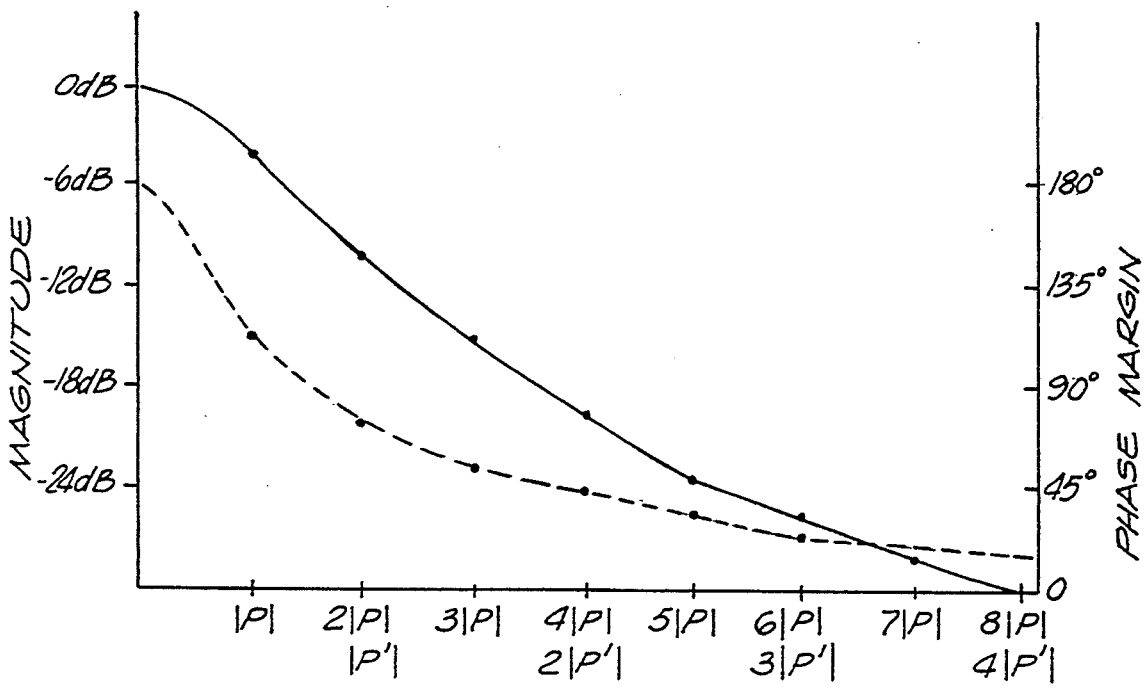
FIG. 7B is a graph of the magnitude and phase response of a system having adjacent poles.

The preferred embodiment can be similarly applied to a bipolar process, as shown in FIG. 6. All NMOS devices are replaced by NPN transistors, and all PMOS devices are replaced by PNP transistors. The collector, base and emitter terminals of the bipolar transistors coincide with the drain, gate and source terminals of the MOS devices, respectively. All transistors with "MN" and "MP" prefixes are replaced with the prefix "Q", designating a bipolar transistor. FIG. 6 also includes diode D1, coupled between the emitter of Q6 (formerly MP6) and node 202, and diode D2, coupled between the emitter of Q7 (formerly MP7) and node 506. The operation of the circuit of FIG. 6 is analogous to that of FIG. 5.

The present invention has a further advantage over the prior art system in that the amplifier can be implemented on an integrated circuit without extra capacitors or resistors. The extra capacitor and resistors, shown in the prior art circuit of FIG. 2, use up a large amount of area on an integrated circuit. Thus, the present invention provides more compactness, better power efficiency, higher stability, lower die temperatures, longer device life, and less complexity for the system designer.

Thus, a new apparatus for current limiting applications has been described.

We claim:

1. A current limiting circuit comprising:
   a single-pole amplifier having a high-frequency pole, an inverting input coupled to a sensing node, a noninverting input coupled to a reference node, and an output dependent on a voltage difference between said noninverting and inverting inputs;
   a voltage-dependent current source coupled to said output and said sensing node, said current source driving a load impedance, said current source and load impedance introducing at least one pole, wherein said pole introduced by said current source and load impedance is at a lower absolute frequency than a pole introduced by said single-pole amplifier, and wherein said load impedance is inductive; and
   a sensing means coupled to said sensing node.

2. The circuit of claim 1 wherein said current source comprises a MOSFET device.

3. The circuit of claim 1 wherein said current source comprises an insulated gate bipolar transistor (IGBT).

4. A method for current limiting a current in a complex load comprising the steps of:
   applying a reference signal to a noninverting input of a single pole amplifier, said single pole amplifier having a high-frequency pole;
   providing an output signal from said amplifier to a control node of a dependent current source;
   applying a current from said current source to a complex load, wherein a pole introduced by said current source and said complex load is at a lower absolute frequency than a pole introduced by said single-pole amplifier, and wherein said complex load is inductive;
   sensing said current to obtain a feedback signal;
   applying said feedback signal to an inverting input of said amplifier.

5. A current limiting circuit comprising:
   a single-pole amplifier having an inverting input coupled to a sensing node, a noninverting input coupled to a reference node, and an output dependent on a voltage difference between said noninverting and inverting inputs;
   a voltage-dependent current source coupled to said output and said sensing node, said current source driving a load impedance, said current source and load impedance introducing at least one pole, wherein said pole introduced by said current source and load impedance is at a lower absolute frequency than a pole introduced by said single-pole amplifier; and a sensing means coupled to said sensing node.

6. The circuit of claim 5 further including a unity gain buffer having a unity gain buffer input coupled to said output of said single-pole amplifier and a unity gain buffer output coupled to said current source.

7. The circuit of claim 5 wherein said current source comprises a MOSFET device.

8. The circuit of claim 5 wherein said current source comprises an insulated gate bipolar transistor (IGBT).

9. The circuit of claim 5 wherein said load impedance is inductive.

10. The circuit of claim 5 wherein said sensing means comprises a resistor.

11. A method for current limiting a current in a complex load comprising the steps of:

applying a reference signal to a noninverting input of a single pole amplifier;

providing an output signal from said amplifier to a control node of a dependent current source;

applying a current from said current source to a complex load, wherein a pole introduced by said current source and said complex load is at a lower absolute frequency than a pole introduced by said single-pole amplifier;

sensing said current to obtain a feedback signal;

applying said feedback signal to an inverting input of said amplifier.

12. The method of claim 11 further including a step of applying said output signal from said amplifier to a unity gain buffer prior to providing said output signal to said control node.

13. The method of claim 11 wherein said current source comprises a MOSFET device.

14. The method of claim 11 wherein said current source comprises an insulated gate bipolar transistor (IGBT).

15. The method of claim 11 wherein said complex load is inductive.

16. The method of claim 11 wherein said step of sensing said current to obtain a feedback signal comprises the steps of providing said current to a resistor, and obtaining a feedback voltage.

* * * * *